United States Patent [19]

Nakasone et al.

[11] 4,155,015

[45] May 15, 1979

[54] LIGHT SWITCH

[76] Inventors: Henry H. Nakasone, 1672 Camrose Way, Anaheim, Calif. 92802; Bruce D. Jimerson, 6415 Corsini Pl., Rancho Palos Verdes, Calif. 90274

[21] Appl. No.: 843,708

[22] Filed: Oct. 20, 1977

[51] Int. Cl.² .............................................. H03K 17/72
[52] U.S. Cl. .............................. 307/252 B; 307/141.8; 307/157; 315/361
[58] Field of Search ............... 307/252 B, 252 N, 112, 307/113, 115, 139, 140, 141.8, 157; 315/194, 320, 322, 350, 351, 352, 361

[56] References Cited

U.S. PATENT DOCUMENTS

| 3,697,821 | 10/1972 | Johnson | 307/115 X |
|---|---|---|---|
| 3,808,456 | 4/1974 | Kay et al. | 307/140 |
| 4,011,482 | 3/1977 | Seib | 315/361 |

Primary Examiner—John Zazworsky

[57] ABSTRACT

The specification discloses a switching system for operating an incandescent lamp from a plurality of stations. The controlling switch at each station is wired in series with the lamp, and other control switches to form a single series circuit. Actuation of any single control switch produces a state change in the controlling circuitry so as to cause the lamp to increase or decrease in brightness. The rate at which the increase or decrease occurs is dependent upon the circuit values.

14 Claims, 1 Drawing Figure

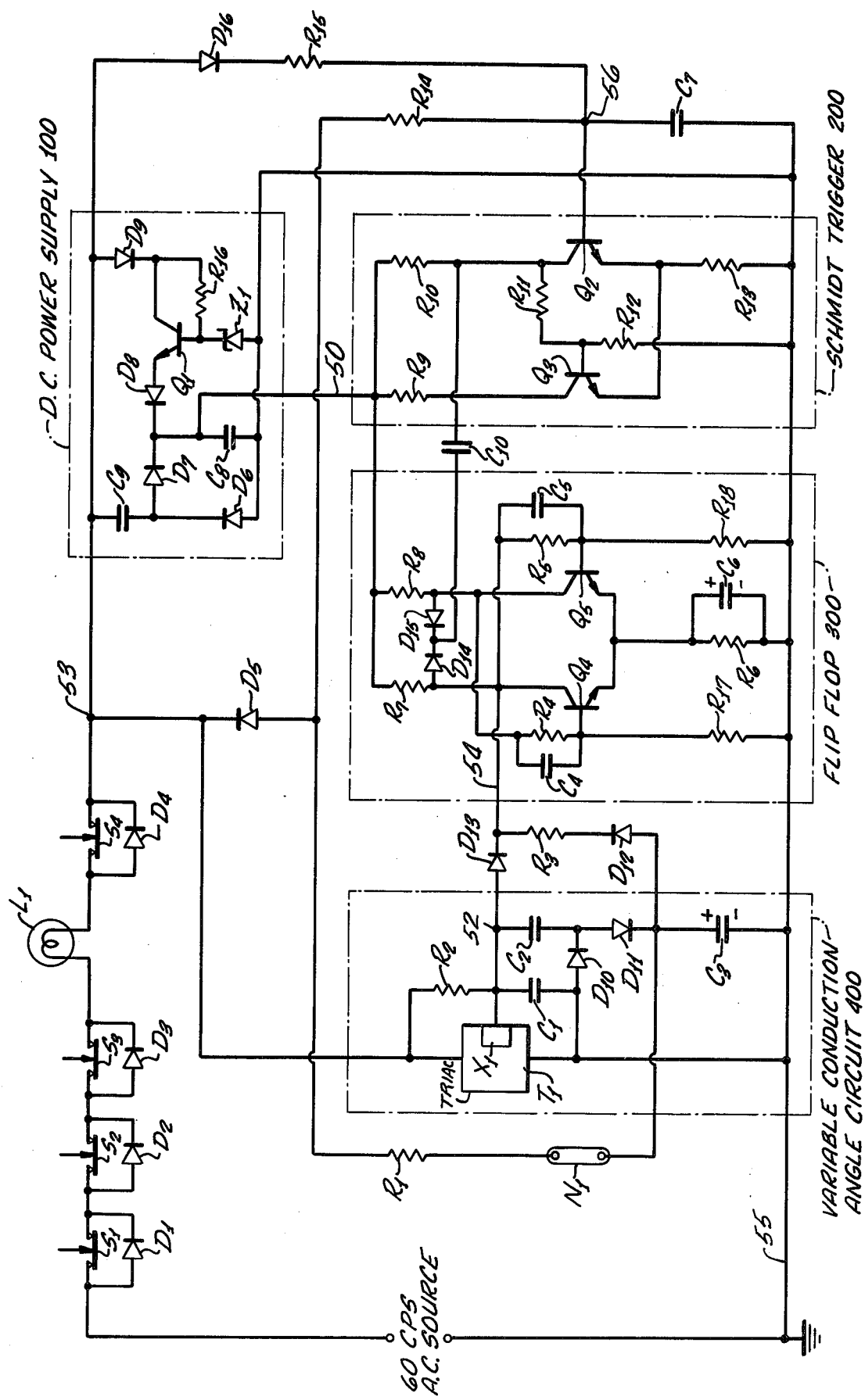

LIGHT SWITCH

CROSS-REFERENCES TO RELATED APPLICATIONS

U.S. Pat. No. 3,898,516, entitled "Lighting Control System For Incandescent Lamps," by Henry H. Nakasone, Aug. 8, 1975;

U.S. Pat. No. 4,008,416, entitled "Circuit For Producting A Gradual Change In Conduction Angle," by Henry H. Nakasone;

U.S. application Ser. No. 768,544, entitled "Momentary Contact Light Switch," by Bruce D. Jimerson and Henry H. Nakasone, filed Feb. 14, 1977;

U.S. application Ser. No. 768,547, entitled "Soft Switch With Rapid Recovery Circuit," by Henry H. Nakasone, filed Feb. 14, 1977.

BACKGROUND OF THE INVENTION

1. Field of the Invention

The invention relates to soft switches which can be used with existing household wiring arrangements to effect control from any other number of separate stations. The contents of the above Patents and Patent Applications are incorporated herein by reference for the purpose of providing background information.

2. Description of the Prior Art

The concept of soft switching, i.e., gradual "turn-on" and "turn-off," has been disclosed in previous Patents by one of the Inventors (e.g. U.S. Pat. Nos. 3,898,516 and 4,008,416) and at least one circuit has been proposed by the same Inventors for producing a momentary contact soft switch.

These prior art circuits, however, cannot be used to effect multiple station control, unless the facility is already specially wired for standard three way operation, i.e., in addition to the wire between each station and one of the lamp terminals, both sides of the AC line must be brought to each of the stations. Thus, in situations where one wishes, for example to operate a table lamp which is plugged into an outlet controlled by a single wall switch, one would have to add additional household wiring to be able to turn the lamp "on" or "off" from the wall switch or the lamp switch. Moreover, if one wished to control a lamp from more than two locations using momentary contact switches, an arrangement like that shown in application Ser. No. 768,544, would not suffice even where the existing wiring was adequate) because such a configuration is inherently limited to a maximum of two stations.

Accordingly, a primary object of the invention is to provide a momentary contact light switch which can be used to replace a conventional mechanical toggle switch at any number of control stations.

Another object of the invention is to provide a momentary contact light switch which does not utilize relays or other mechanical devices to effect a change in the state of the system.

A further object of the invention is to provide a switch which can be added to any existing wiring configuration to effect control from more than one station.

Another object of the invention is to provide a momentary contact switch which can be wired in series with any number of similar momentary contact switches so that each switch is capable of controlling the application of power to a load independent of every other switch.

Another object of the invention is to provide a momentary contact switch which will eliminate the need for 3-way (or more) household wiring arrangements to effect control of a light from a plurality of separate stations.

Another object of the invention is to provide a gradual change in the amount of AC power applied to a load following the depression of any one of a plurality of series connected momentary contact switches.

Another object of the invention is to provide gradual turn-on and turn-off of a lamp from one or more momentary contact switches which are series interconnected with the lamp and AC power source.

Other objects and advantages of the present invention will be obvious from the detailed description of a preferred embodiment given hereinbelow.

SUMMARY OF THE INVENTION

The aforementioned objects are realized by the present invention which comprises one or more normally closed momentary contact switches, each of which is bypassed by a diode. The control circuit, (which may physically be located at one of the switch stations) comprises a low current power supply, a Schmidt trigger, a bistable multi-vibrator (or Flip Flop) and a variable conduction angle circuit. The low current power supply generates a DC voltage for operating the Schmidt trigger and Flip Flop. Depression of any series switch momentarily removes one input polarity which causes the Schmidt trigger to temporarily change state. This, in turn, compliments the Flip Flop which functions to allow the variable conduction angle circuit to commence a progressive increase (if the lamp was initially "off" or to abruptly cut off conduction during one polarity followed by a gradual decrease in the conducting angle during the other polarity (if the lamp was initially "on").

DESCRIPTION OF THE DRAWING

The Figure shows a schematic diagram of a preferred embodiment of the invention.

DETAILED DESCRIPTION OF A PREFERRED EMBODIMENT

Adverting to the Drawing, there is shown a control circuit together with a lamp $L_1$ and four control switches $S_1$, $S_2$, $S_3$ and $S_4$. It will be understood, however, that any number of control switches could be utilized, and that each would be located at a separate station. Each switch is normally "closed" so that AC power is applied to the lamp $L_1$ and control circuit until one of the switches $S_1$ - $S_4$ is momentarily depressed. When this occurs, only the positive fraction of each AC cycle is applied to the lamp $L_1$, and circuitry. The momentary interruption of the negative half cycle operates in a manner to be described below to gradually turn the lamp from "off" to "on" or from "on" to "off" as the case may be. Each switch ($S_1$ - $S_4$), therefore, is capable of effecting the same transition, and hence any number of switches could be so connected so as to operate the lamp $L_1$. Since only one control circuit is required for any number of switches, it can be located at any station (for example, it may be incorporated in the same structure as that used to house $S_4$) or it may be built into an adaptor at the Lamp $L_1$, or located at any point in-between switch stations, whatever.

Referring now to the particular components of the control circuit, there is shown a Schmidt Trigger 200,

[comprising Resistors $R_9$, $R_{10}$, $R_{11}$, $R_{12}$ and $R_{13}$; and transistors $Q_2$ and $Q_3$], a Flip flop 300 [comprising transistors $Q_4$, and $Q_5$; Resistors $R_4$, $R_5$, $R_6$, $R_7$, $R_8$, $R_{17}$ and $R_{18}$ commutating capacitors $C_4$ and $C_5$; bypass capacitor $C_6$; and steering diodes $D_{14}$ and $D_{15}$]. Both the Schmidt trigger and Flip Flop are supplied with an operating voltage (line 50) from a DC power supply 100, [comprising capacitors $C_8$ and $C_9$; Transistor $Q_1$; Diodes $D_6$, $D_7$, $D_8$ and $D_9$; Resistor $R_{16}$ and Zener Diode $Z_1$.] The output of the Flip Flop 300 (line 54) is coupled to the input of a variable conduction angle circuit 400 through Diode $D_{13}$. This latter circuit functions in a manner analogous to the circuit shown in Application Ser. No. 768,547, cited hereinabove. Its operation may be briefly described as follows: If the charge on accumulating capacitor $C_3$ is low, capacitor $C_2$ (being effectively connected to ground through the low impedance of $D_{10}$ during the negative half cycles and through $D_{11}$ and $C_3$ during the positive half cycles) functions to delay the phase of the voltage applied through resistor $R_2$ so as to reliably prevent the potential on line 52 from exceeding that which is required to breakdown Diac $X_1$. As long as this condition remains, Triac $T_1$ does not fire during either the positive or negative half cycle of the AC input which appears on line 53. If, however, the state of Flip Flop 300 is such that $Q_4$ does not conduct, line 54 will be positive, and hence $C_3$ will be charged through $R_2$, $C_2$ and $D_{11}$, during each positive half cycle of the AC source. As $C_3$ charges the phase shifting effect of $C_2$ is reduced, and the voltage on line 52 will reach a magnitude which exceeds the breakdown voltage of Diac $X_1$ near the end of each half cycle. When this occurs, $X_1$ will conduct, discharging $C_1$ through the gate of $T_1$, thus causing $T_1$ to conduct during the latter part of each half cycle. As $C_3$ continues to charge, during each positive half cycle, the conduction duration of $T_1$ increases (i.e., $T_1$ fires at an earlier time during each successive half cycle) until the lamp $L_1$ is fully turned "on." It will thus be seen that the intensity of Lamp $L_1$ is dependent upon the charge on $C_3$. With this background, an explanation of the operation of the entire circuit can be undertaken.

Assume, for example, that as an initial condition, all switches $S_1$, $S_2$, $S_3$ and $S_4$ are in their normal position and that Flip Flop 300 is in the "off" state ($Q_4$ conducting) so that line 54 is approximately at ground. $C_3$ will be assumed to be at zero volts, and hence $T_1$ is not conducting, so that the full value of the AC source appears on line 53. In this condition, $C_3$ is kept discharged by the negative current flowing through $D_5$, resistor $R_1$ and the ¼ watt neon indicator lamp $N_1$ (which breaks down whenever the magnitude of the negative half of the voltage on line 53 exceeds 80 volts). The positive waveform applied to $R_2$ is clamped by Diode $D_{13}$, so that virtually no current flows through Diode $D_{11}$. The potential at point 56 remains near zero because of the combined positive current flowing through $D_{16}$ and $R_{15}$ and the negative current flowing through $R_{14}$ and $D_5$. As a consequence, $Q_2$ is "off" and $Q_3$ is "on". In this condition, the power supply 100 will output approximately 65 volts on line 50, the value of $C_9$ being chosen (in conjunction with the load requirements of Flip Flop 300 and Schmidt trigger 200) such that the average potential on $C_8$ will exceed the breakdown voltage of $Z_1$ (as a consequence $Q_1$ will be cut-off so that very little power will be dissipated by the power supply 100).

In order to change from the quiescent "off" state described above, any one of the switches ($S_1 - S_4$) can be actuated to temporarily interrupt the negative half cycle. Assume, for example, that $S_3$ is momentarily depressed, the voltage on $C_7$ will immediately begin to increase positively; [preferably, the components $R_{15}$ and $C_7$ will be chosen such that the voltage on $C_7$ will rise to a point to cause $Q_2$ to conduct in approximately 6 cycles or about 1/10 ssecond]. When this occurs, Schmidt trigger 200 fires, causing the collector of $Q_2$ to abruptly fall to ground. This negative transition is coupled through trigger capacitor $C_{10}$ causing Flip Flop 300 to change state. $Q_4$ thus stops conducting, so the positive half of the AC cycle is no longer clamped to ground by $D_{13}$. $C_3$ thus commences to charge through $R_2$, $C_2$ and $D_{11}$ as previously explained.

When the quiescent "on" state is reached, most of the input AC source will be dropped across the lamp $L_1$ (i.e., the waveform on line 53 will follow the input AC source until $T_1$ fires, at which point it will be abruptly reduced to nearly zero). Since the value of $R_2$ and the value of $C_1$ will preferably be chosen to obtain as large a conduction angle as possible, the maximum potential on line 53 will be reduced to less than 60 volts, and the duration of each positive and negative excursion will be approximately one millisecond.

Because of the reduced amplitude and duration of the voltage on line 53, the capacitor $C_9$ will be unable to supply sufficient current to maintain the charge on $C_8$. As a consequence, the voltage on $C_8$ drops until $Q_1$ becomes conductive, i.e., whenever the potential on $C_8$ drops below the breakdown voltage of Zener $Z_1$, transistor $Q_1$ will conduct to maintain the charge on $C_8$. Thus, $C_9$ function is to charge $C_8$ when the lamp is "off" and $Q_1$ functions to charge $C_8$ when the lamp is "on."

Once the circuit is triggered to the "on" state, it will remain until one of the switches $S_1$-$S_4$ is depressed. $C_3$ will charge to a peak value approximately equal to the voltage on line 50. In this state, only a very small current flowing through $R_2$ will be required to maintain the charge on $C_3$ since: (1) the maximum potential on 53 is reduced to less than that required to ionize neon $N_1$, and, (2) the potential on line 54 is approximately equal to that on $C_3$, so that almost no current flows through resistor $R_3$ (typically 500K or larger). Before considering "turn off" it will be assumed that Schmidt trigger 200 returned to its original state ($Q_2$ "off") immediately after the actuating switch $S_3$ was released, and that it is now in readiness to be retriggered by a second momentary interruption of the negative half cycle of the AC power source.

In order to initiate "turn-off," any one of the switches $S_1$-$S_4$may be actuated. Assume, for example, that $S_1$is depressed so as to momentarily interrupt the negative half cycle of the AC source. The power applied to will immediately drop by 50%, and $C_7$ will commence charging positively through $R_{15}$ and $D_{16}$. Since the average positive voltage available on line 53 is now considerably less than that available to charge $C_7$ when initiating "turn-on," more time will be required to raise the potential on line 56 to a level sufficient to operate Schmidt trigger 200. Thus, if 20 cycles are required, the Schmidt 200 will be triggered in ⅓ of a second. Flip Flop 300 is then complemented so that $Q_4$ conducts. The positive portion of the AC waveform will then be clamped through $D_{13}$, and $C_3$ will begin to discharge through $D_{12}$ and $R_3$. Upon release of $S_1$, the negative half of the source becomes available to trigger $T_1$. This occurs, however, at a progressively later time during each negative half cycle due to the gradual discharge of $C_3$. When the conduction of $T_1$ is delayed to a point such that the magnitude of the negative waveform at 53 is sufficient to ionize $N_1$, the rate of discharge of $C_3$ is increased rapidly, causing the intensity of the lamp to abruptly diminish.

To recapitulate, momentary depression of $S_1$, actuates Schmidt trigger 200, which in turn complements Flip Flop 300, the latter functioning: (1) to abruptly reduce the lamp intensity by clamping the positive gating signal at 52 through $D_{13}$; and (2) to continue thereafter, to gradually discharge $C_3$ through $D_{12}$ and $R_3$ so as to cause the light intensity to decrease slowly until it is abruptly extinguished by the rapid discharge of $C_3$ via neon $N_1$. The rate at which the lamp intensity rises during "turn-on," is determined primarily by the value of $C_3$. Thus, for a 2 to 3 seconds fade-in, a value of $10\mu f$ can be used. It will be understood, however, that a large value is not necessary for the purpose of extending lamp life, and that the life expectancies of common incandescent lamps can be greatly extended even though "turn-on" appears to occur almost instantaneously. In a like manner, the "turn-off" time can be controlled, so as to be instantaneous or gradual. One advantage of gradual decay lies in the fact that the operator is instantly informed of the fact that actuation has taken place (by the 50% decrease in intensity), yet there is sufficient light for several seconds to permit safe departure. Although the invention has been illustrated with the aid of a particular embodiment, it will be understood that the basic concepts are not limited thereto, and that numerous changes, modifications and substitutions may be made without departing from the spirit of the invention.

What is claimed is:

1. A circuit for controlling the power applied to a load, from an A.C. source comprising:
   semiconductor switching means having a pair of main terminals and a gate terminal for producing a change in the impedance between said main terminals:
   means for series connecting the main terminals of said semiconductor switching means between the load and A.C. source;
   D.C. power supply means connected to the A.C. source for generating a D.C. voltage;
   a bistable circuit connected to receive power from said D.C. power supply means;
   R-C-diode network means for coupling the output of said bistable circuit to the gate of said semiconductor switching means;
   momentary interrupt means connected to the AC power source for eliminating at least one polarity of an AC source;
   trigger means responsively connected to the AC power source and said DC power supply means for detecting and producing an output signal when the power from the AC power source is interrupted by said momentary means;
   coupling means connecting the output signal from said trigger means to the input of said bistable circuit for causing said bistable circuit to change state whenever an interruption of the AC power source is detected by said trigger means.

2. The apparatus recited in clam 1 wherein said momentary interrupt means comprises at least one control switch having a pair of normally closed contacts.

3. The apparatus recited in claim 2 wherein the normally closed contacts of said control switch are bridged by a rectifier means whereby actuation of said control switch functions to open the normally closed contact so as to interrupt only one polarity of the AC power.

4. The apparatus recited in claim 3 wherein said trigger means comprises a Schmidt trigger having a trigger input terminal, and wherein said means for detecting the interruption of the AC power comprises:
   Diode-resistor network means connected to the input terminal of said Schmidt trigger and the AC power source for providing an increase in the voltage level applied to the input terminal of said Schmidt trigger whenever said control switch is actuated to interrupt one polarity of the AC power.

5. The apparatus recited in claim 1 wherein said D.C. power supply means comprises:
   a storage capacitor for maintaining a DC voltage;
   a charging capacitor having one terminal connected to an AC source;
   diode means connected between the other terminal of said charging capacitor and said storage capacitor for charging said storage capacitor whenever the instantaneous value of the AC power source exceeds the voltage on said storage capacitor;
   semiconductor current control means connected to the AC source and said storage capacitor for maintaining a charge on said storage capacitor.

6. The apparatus recited in claim 1 including a phase control means comprising:
   resistor means connected between one main terminal of said semiconductor switching means and the gate terminal of said semiconductor switching means;
   a phase delaying capacitor having one terminal connected to the gate terminal of said semiconductor switching means;
   accumulating capacitor-diode network means connected to the other terminal of said phase delaying capacitor for varying the time at which the phase delaying effect of said phase delaying capacitor becomes effective in accordance with the charge on said accumulating capacitor.

7. A system for operating a load from an AC power source comprising:
   at least one normally closed switching contact means connected in series with the AC source for momentarily interrupting at least one polarity of an AC power source;
   sensing means for detecting whenever the AC power has been interrupted by actuation of said normally closed switching means;
   bistable means having a first and second stable state for remembering an AC power interruption, said bistable means being responsively connected to said sensing means to change states whenever said sensing means detects an interruption of the AC power;
   switching means responsively connected to said bistable means for applying power to the load when said bistable means is in a first stage, and for removing power from the load when said bistable means is in a second state.

8. The apparatus recited in claim 7 wherein said switching means includes:
   a variable phase shifting means for gradually increasing the power applied to the load when said bistable means changes from a second state to a first state.

9. The apparatus recited in claim 7 wherein said switching means includes;
   means for abruptly reducing the power level applied to the load when said bistable means changes from a first state to a second state and a variable phase shifting means for gradually decreasing the power applied to the load following the abrupt decrease in power.

10. The apparatus recited in claim 7 wherein is included:
    a rectifier in parallel with said normally closed switching contact means for maintaining the continuity of at least one polarity of the AC power when said switching contacts are opened.

11. A switching system for an AC powered device comprising:
    a solid state switching device having anode and cathode main terminals and gate terminal means for altering the impedance between said main terminals from a high impedance state to a low impedance state;
    means for connecting the main terminals of said solid state switching device in series with a load and an AC power source;
    momentary interrupt switching means connected to the A.C. power source for initiating a "turn-on" process from a first system state or a "turn-off" process from a second system state;
    an accumulating capacitor;
    first rectifying means connected to said accumulating capacitor for progressively increasing the charge on said accumulating capacitor following actuation of said momentary interrupt switching means at a time when the system resides in a first state;
    discharge means connected to said accumulating capacitor for discharging said accumulating capacitor following actuation of said momentary interrupt switching means at a time when the system resides in a second state;
    phase shifting means connected to the gate terminal of said solid state switching device for delaying the phase time at which the magnitude of the voltage applied to the gate terminal is sufficient to cause the impedance between the main terminals of said solid state switching device to change from a high value to a low value;
    means for connecting said accumulating capacitor to said phase shifting means so as to vary the phase time at which the magnitude of the voltage applied to the gate terminal is sufficient to cause the impedance between the main terminals of said solid state switching device to change from a high value to a low value as an inverse function of the charge stored by said accumulating capacitor.

12. The apparatus recited in claim 11 wherein said momentary interrupt switching means connected in series with the AC power source, load and main terminals of said solid state switching device.

13. The apparatus recited in claim 12 wherein is included:
    second rectifying means connected across the terminals of said momentary interrupt switching means for maintaining the continuity of one polarity of the AC source across the main terminals of said solid state switching device when said momentary interrupt switching means is actuated.

14. The apparatus recited in claim 13 wherein is included:
    sensing means connected across the main terminals of said solid stage switching device for detecting the interruption of one polarity of the AC source and;
    a bistable circuit responsively connected to said sensing means so as to change state whenever an interruption of one polarity of the AC power source is detected by said sensing means, and;
    network means for connecting the output of said bistable circuit to said first rectifying means and said discharge means whereby the charge on said accumulating capacitor will be caused to increase or decrease in accordance with the state of said bistable circuit.

* * * * *